United States Patent [19]
Ko

[11] Patent Number: 5,428,298
[45] Date of Patent: Jun. 27, 1995

[54] PROBE STRUCTURE FOR TESTING A SEMICONDUCTOR CHIP AND A PRESS MEMBER FOR SAME

[75] Inventor: Jun S. Ko, Seoul, Rep. of Korea

[73] Assignee: Gold Star Electron Co., Ltd., Seoul, Rep. of Korea

[21] Appl. No.: 272,106

[22] Filed: Jul. 7, 1994

Related U.S. Application Data

[63] Continuation of Ser. No. 913,722, Jul. 16, 1992, abandoned.

[30] Foreign Application Priority Data

Jul. 18, 1991 [KR] Rep. of Korea .............. 12274-1991

[51] Int. Cl.⁶ .............................................. G01R 1/04
[52] U.S. Cl. ................................... 324/762; 324/757
[58] Field of Search ............... 324/73.1, 158 R, 158 F, 324/158 P, 757, 762; 228/115; 174/52 FR

[56] References Cited

U.S. PATENT DOCUMENTS

| | | | |
|---|---|---|---|
| 4,443,755 | 4/1984 | Wooten | 324/66 |
| 4,785,137 | 11/1988 | Samuels | 174/52 FP |
| 4,804,132 | 2/1989 | DiFrancesco | 228/115 |
| 5,008,614 | 4/1991 | Shreeve et al. | 324/158 F |
| 5,010,246 | 4/1991 | Nishikawa | 250/306 |
| 5,196,785 | 3/1993 | Douglas | 324/158 F |

Primary Examiner—Kenneth A. Wieder
Assistant Examiner—Barry C. Bowser

[57] ABSTRACT

A tester applicable to semiconduction chips having a plurality of pins. The tester comprises a TAB tape having an adhesive surface and a plurality of connecting wires attached to the adhesive surface of the TAB tape and connected to a test card. At a probe region of the tester, probe tips are disposed which come into contact with pads of the semiconductor chip to be tested, upon testing. Each probe tip is made of a palladium layer having a serrated edge grown to shape over a nickel film on a portion of each connecting wire, which portion is disposed at the probe region. The tester can test a semiconductor chip having a plurality of pins and carry out simultaneous probings of a semiconductor chip having the number of pins enabling a TAB chip bonding. Both a functional test and a burn-in test may be carried out with a single test system. Since the tester has many sharp probe tips made of dendritic-grown palladium, it can provide an improvement in proving effect. The sharp probe chips also eliminate a non-contact problem.

6 Claims, 3 Drawing Sheets

PROBE STRUCTURE FOR TESTING A SEMICONDUCTOR CHIP AND A PRESS MEMBER FOR SAME

This application is a continuation of application Ser. No. 07/913,722 filed on Jul. 16, 1992, now abandoned.

BACKGROUND OF THE INVENTION

1. Field of the invention

The present invention relates to a tester for semiconductor chips, and more particularly to a tester for semiconductor chips which are applicable to semiconductor chips having a plurality of pins.

2. Description of the Prior Art

Generally, functional tests for finished semiconductor chips are carried out in such a manner that pads of a semiconductor chip are in contact with corresponding external probe tips to flow current through it followed by an output from the semiconductor chip being checked.

Referring to FIG. 1, there is shown a conventional tester adapted to achieve a functional test of semiconductor chips. The tester comprises aluminum pads 3 which are exposed outwardly of a passivation layer 2 applied to a semiconductor chip 1, probe tips 4 of metal wires adapted to come into contact with respective corresponding aluminum pads 3 and probe wires 5 each connected at one end thereof to each corresponding probe tip 4 and at the other end thereof a test card (not shown). The reference numeral 6 denotes a microscope for inspecting the semiconductor chip 1 to dispose it at a predetermined position.

Operation of the above tester for semiconductor chips will be now described. First, the semiconductor chip 1 is placed on a testing mount 7 and the probe tips 4 each placed in position on the corresponding aluminum pad 3 by movement of the semiconductor chip 1 while carrying out an inspection by means of the microscope. Thereafter, an electrical property/of the semiconductor chip is checked by the test card which is connected to the aluminum pad 3 on the semi conductor 1 via the probe wires 5.

The conventional tester for semiconductor chips has fine probe tips. However, since probe wires connected to the probe tips have large diameter and thus occupy large space, the tester is hard to have many probe tips and to test simultaneously a plurality of pins of a semiconductor chip. In other words, although the conventional tester is capable of testing a semiconductor chip having a few of pins, it can not do simultaneously probings for semiconductor chip having many pins such as a logic tip. This is because the tester has insufficient space to make probe tips come into contact with all pins of the semiconductor chip.

SUMMARY OF THE INVENTION

The present invention has been made in view of the abovedescribed prior art problems and an object of the invention is to provide a tester for semiconductor chips which can test a semiconductor chip having relatively many pins.

In accordance with the present invention, the object mentioned above can be accomplished by providing a tester for semiconductor chips having a probe region at which the tester comes into contact with pads of a semiconductor chip to be tested, the tester comprising: a tape automated bonding tape having an adhesive surface; a plurality of connecting wires attached to the adhesive surface of the TAB tape and connected to a test card; and a plurality of probe tips disposed at the probe region and adapted to come into contact with pads of the semiconductor chip to be tested, respectively, each of the probe tips being made of a metal layer dendritic-grown on a portion of each corresponding connecting wire, which portion is disposed at the probe region.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENTS

The present invention will now be described by referring to FIGS. 2 to 6 in the accompanying drawings.

Figure 2:
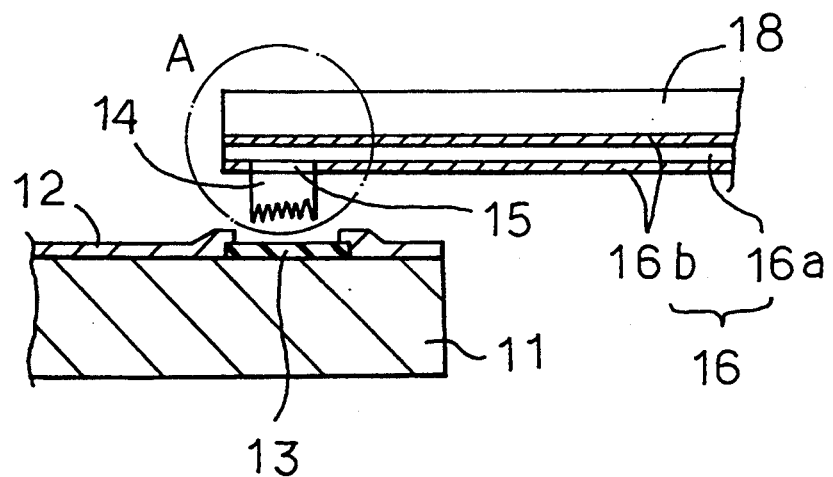
FIG. 2 is a sectional view showing a tester for semiconductor chips according to an embodiment of the present invention.
Figure 3:
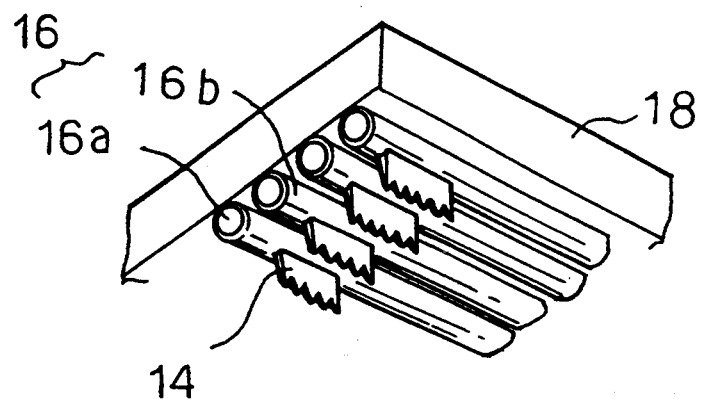
FIG. 3 is an enlarged perspective view of dotted circle A of FIG. 2.

Referring now to FIGS. 2 and 3, there are shown a tester for semiconductor chips according to the present invention and a portion A of the tester, respectively. As illustrated in FIG. 3, a plurality by of connecting wires 16 are arranged parallel to one another on the same plane and attached to an adhesive surface of TAB(tape automated bonding) tape made of polyimide. Each connecting wire 16 has one end positioned at a probe region in which upon testing, elements of the tester come into contact with aluminum pads 13 exposed outwardly of a passivation layer 12 formed on a semiconductor chip 11 to be tested.

At the probe region, each connecting wire 16 has a probe tip 14 which is formed by dendritic-growing palladium on the one end of connecting wire 16. Each probe tip 14 extends downwardly from the corresponding connecting wire 16. At regions except for the probe region, each connecting wire 16 has a copper wire 16a and a chrome film 16b coated on the copper wire 16a.

At the probe region, each connecting wire 16 also has a nickel film 15 coated on the copper wire 16a to have a thickness of about 1 µm. On the nickel films 15, the probe tips 14 are formed, respectively. The formation of probe tips 14 is achieved by plating palladium at a very high current density of, for example, not less than 100 mA/cm.2 During the plating, the palladium is dendritic-grown to have an aspect ratio of 20 or more and thus has a serrated-shaped end.

The probe tip 14 have a high rigidity, because of being dendritic-grown as described above. Therefore, they are not bent or broken even after coming into contact with the aluminum pads 13 many times. In particular, the serrated-shaped ends of probe tips 14 make it possible for the probe tips 14 to come into positive contact with the aluminum pads 13 of the semiconductor chip.

As mentioned above, the connecting wires 16 at regions other than the probe region has the chrome film 16b coated on the copper wire 16a and thus have an electrically nonconductive chrome oxide which prevents the plating of palladium at regions other than the probe region.

Particularly, use of the TAB tape made of polyimide wire prevent a mechanical property of the connecting wires 16 from being deteriorated due to repeated uses. By virtue of the elasticity of polyimide, the TAB tape is not subjected to a plastic deformation.

Figure 4:
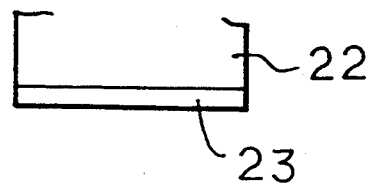
FIG. 4 is a schematic perspective view showing operating condition of the tester for semiconductor chips according to the present invention.
Figure 4:
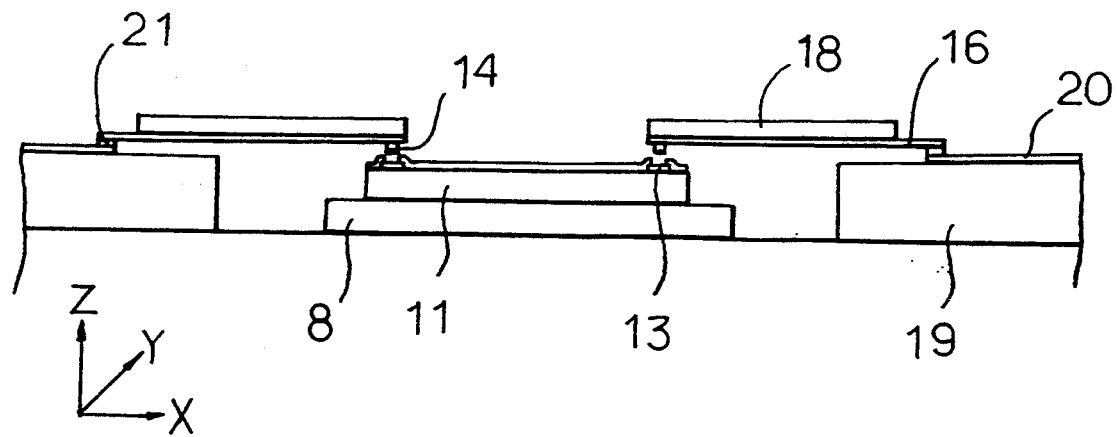

With reference to FIG. 4, there is shown operating condition of the tester for semiconductor chips according to the invention. A plurality of wires 20 are mounted on a test card 19. Each of the wires 20 is eternally bonded at one end thereof to an outer lead of the corresponding connecting wire 16 by means of gold bump or lead-tin (Pb-Sn) material, to form an outer lead bond 21. In order that the probe tips 14 come into pressing contact with the aluminum pads 13, there is provided a press 22 which is provided with an elastic body 23 attached to its lower end.

Figure 1:
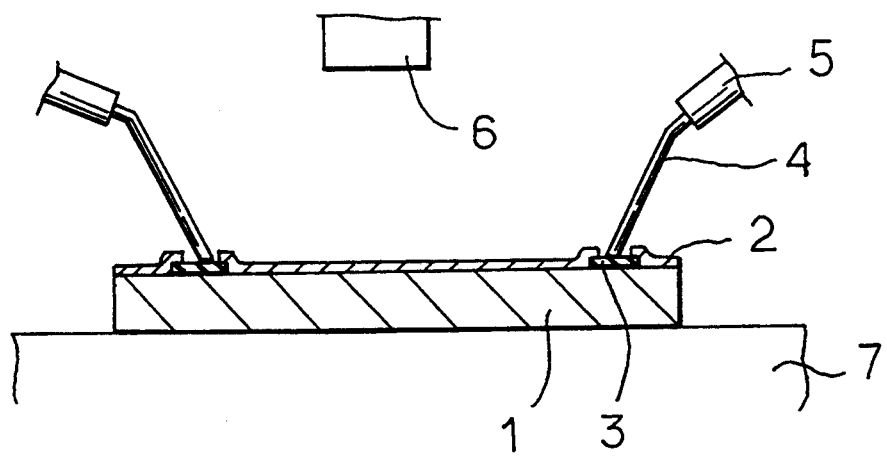
FIG. 1 is a schematic sectional view showing a conventional tester for semiconductor chips.

In operation of the tester for semiconductor chips according to the present invention, first, a semiconductor chip 11 to be tested is mounted on a semiconductor chip holder 8 which can move in directions of X and Y (see FIG. 4) and then placed on a testing mounter 7. Then, the TAB tape 18 to which the probe tips 14 made of dendritic-grown palladium are attached by means of connecting wires 16 approaches to the upper surface of semiconductor chip 11. Thereafter, the semiconductor chip 11 mounted on the chip holder 7 is positioned in position with reference to the probe tips 14 by a movement of the testing mounter 8 on the testing mounter 7 in directions of X and Y while being inspected by a microscope (see FIG. 1).

Figure 5:
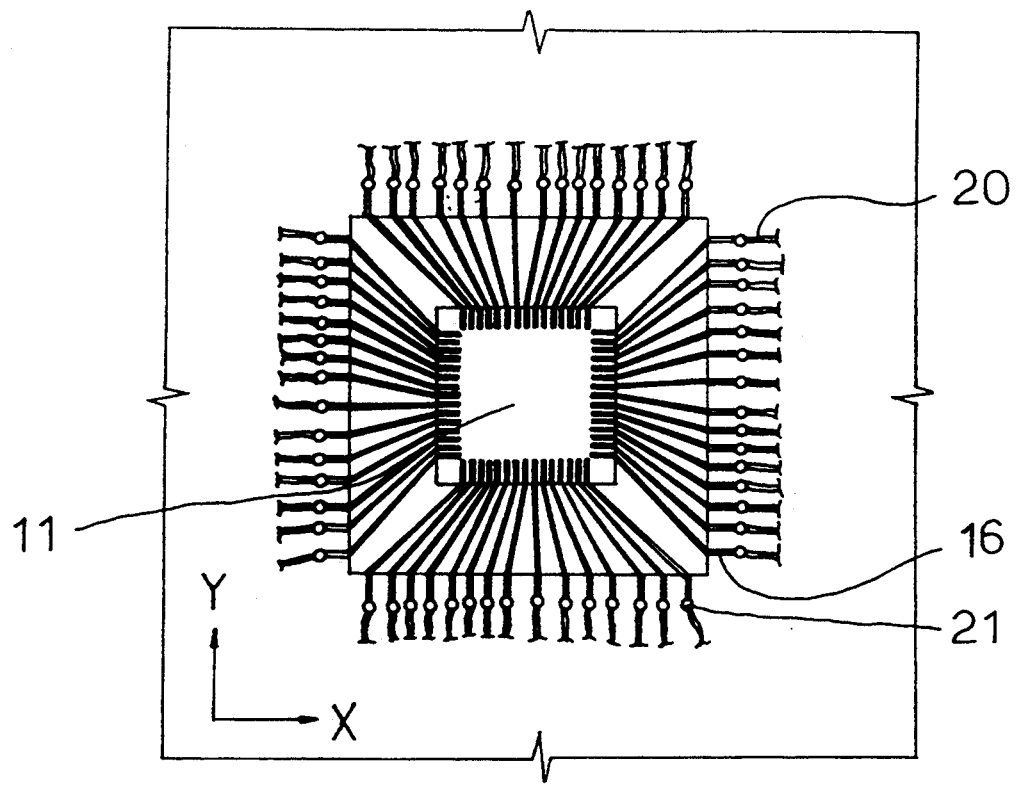
FIG. 5 is a top plan view showing the condition that a plurality of connecting wires of the tester according to the present invention are aligned with a plurality of pins of a semi conductor chip, respectively.

Referring to FIG. 5, there is shown a condition that a plurality of connecting wires of the tester according to the invention are aligned with a plurality of pins of a semiconductor chip, respectively. In FIG. 5, elements substantially equal to those shown in FIGS. 2 to 4 are designated by the reference numerals identical with those of FIGS. 2 to 4.

Thereafter, the press 22 having the elastic body 23 is lowered to the inner leads of the TAB tape 18 so that the probe tips 14 of the TAB tape come into pressing contact with the aluminum pads 13 of the semi conductor chip 11, respectively. Then, a functional test is carried out by flowing current into the semiconductor chip 11 via the connecting wires 16. During the test, the elastic body 23 attached to the press 22 eliminates an occurrence of stress due to the difference in height between the pins of the semiconductor chip 11 and the TAB tape 18 and achieves uniform loading to the pins of the semi conductor chip 11. The elastic body 23 also functions to provide even compliance to the TAB tape 18.

Figure 6:
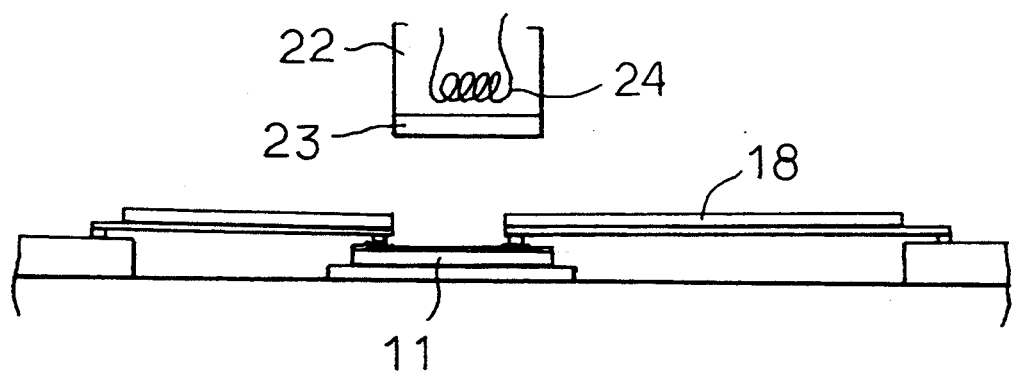
FIG. 6 is a schematic sectional view showing a tester for semiconductor chips according to another embodiment of the present invention for carrying out a burn-in test.

With reference to FIG. 6, there is shown the case wherein the tester for semiconductor chips according to the invention is applied to a burn-in test which is carried out at high temperature of about 125° C. in order to remove initial inferior products. As shown in FIG. 6, the overall structure of this tester is substantially identical to the tester applied to the functional test shown in FIG. 4, except that the press 22 of the tester shown in FIG. 6 is equipped with a heater 24.

In operation of the tester applied to the burn-in test, the TAB tape 18 is pressed down by a downward movement of the press 22 so that the aluminum pads 13 come into contact with the corresponding probe tips 14, respectively. Then, the heater 24 is energized to heat the semiconductor chip 11 to a temperature predetermined for the burn-in test.

As apparent from the above description, the tester for semiconductor chips according to the present invention can test a semiconductor chip having a plurality of pins, and particularly can carry out simultaneous probings of the semiconductor chip having the number of pins enabling a TAB chip bonding.

In accordance with the present invention, both the functional test and the bern-in test may be also carried out by a single test system. In addition, since the tester according the invention comprises a plurality of sharp probe tips made of dendritic-grown palladium, it can provide an improvement in proving effect. The sharp probe chips also eliminate a non-contact problem which may occur when the probe tips come into contact with pads of a semi conductor chip.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A probe structure for testing a semiconductor chip, comprising:
    a chromium coated metal wire having an end portion devoid of chromium;
    a layer of nickel formed on the surface of said end portion devoid of chromium;
    a protruding layer of palladium including a serrated outer edge formed on the layer of nickel; and
    a tape member having an adhesive surface for attaching and fixing the metal wire thereto.

2. The probe structure according to claim 1 wherein said metal wire comprises copper wire.

3. The probe structure according to claim 1 wherein said tape comprises TAB (tape automated banding) tape.

4. Apparatus for testing a semiconductor chip, comprising:
    a test probe comprised of,
    a chromium coated metal wire having an end portion devoid of chromium;
    a layer of nickel formed on the surface of said end portion devoid of chromium;
    an outwardly protruding layer of palladium including serrated outer edge formed on the layer of nickel at said end portion;
    a tape member having an adhesive surface for attaching and fixing the metal wire probe thereto; and
    a press member for pressing said serrated outer edge of said layer of palladium down on a pad of a semiconductor chip under test.

5. The apparatus according to claim 4 wherein said press member includes an elastic body on a bottom surface thereof for contacting an upper portion of said metal wire probe during a test of said semiconductor chip.

6. The apparatus according to claim 4 and additionally including a heater element in said press member for carrying out a burn-in test of said semiconductor chip.

* * * * *